(12) United States Patent
Lebby

(10) Patent No.: US 8,331,413 B2
(45) Date of Patent: Dec. 11, 2012

(54) INTEGRATED RARE EARTH DEVICES

(76) Inventor: Michael Lebby, Apache Junction, AZ (US)

( * ) Notice: Subject to any disclaimer, the term of this patent is extended or adjusted under 35 U.S.C. 154(b) by 190 days.

(21) Appl. No.: 12/700,635

(22) Filed: Feb. 4, 2010

(65) Prior Publication Data

US 2011/0188533 A1    Aug. 4, 2011

(51) Int. Cl.
*H01S 5/00*    (2006.01)
(52) U.S. Cl. .............. 372/50.124; 372/43.01; 372/46.01; 372/50.1; 372/50.21
(58) Field of Classification Search .............. 372/50.124, 372/43.01, 46.01, 50.1, 50.21; 257/84, 635, 257/E33.077
See application file for complete search history.

(56) References Cited

U.S. PATENT DOCUMENTS

2004/0021185 A1 *    2/2004    Oberhardt et al. ............ 257/414
2004/0232412 A1 *    11/2004    Burgener et al. ............... 257/40

* cited by examiner

*Primary Examiner* — Dung Nguyen
(74) *Attorney, Agent, or Firm* — Parsons & Goltry; Robert A. Parsons; Michael W. Goltry

(57) ABSTRACT

The invention includes a single chip having multiple different devices integrated thereon for a common purpose. The chip includes a substrate having a peripheral area, a mid-chip area, and a central area. A plurality of FETs are formed in the peripheral area with each FET having a layer of single crystal rare earth material in at least one of a conductive channel, a gate insulator, or a gate stack. A plurality of photonic devices including light emitting diodes or vertical cavity surface emitting lasers are formed in the mid-chip area with each photonic device having an active layer of single crystal rare earth material. A plurality of photo detectors are formed in the central area.

15 Claims, 4 Drawing Sheets

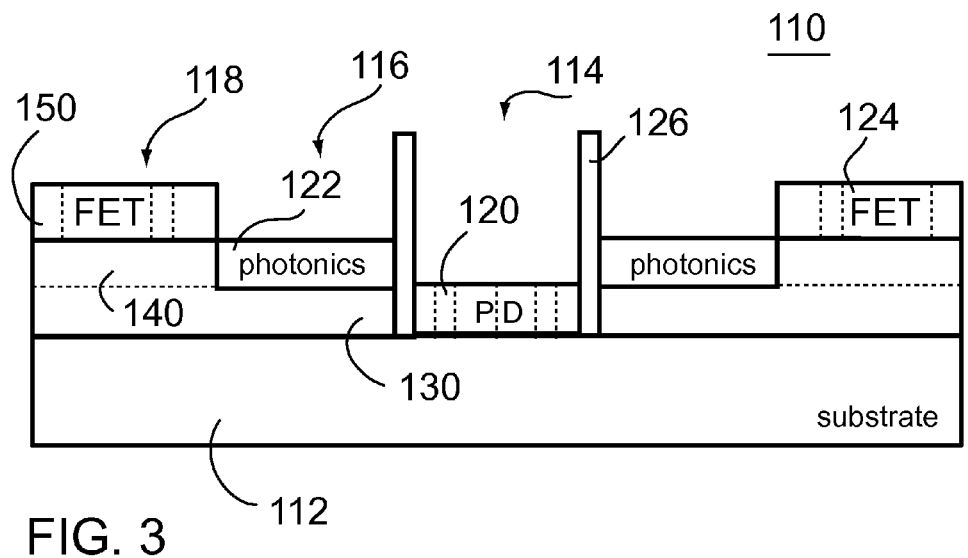
FIG. 3
FIG. 4
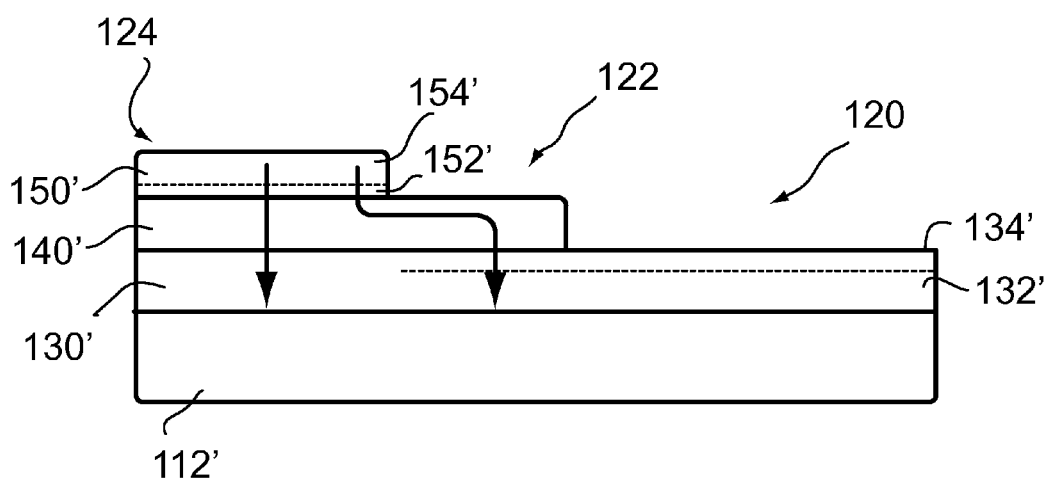

INTEGRATED RARE EARTH DEVICES

FIELD OF THE INVENTION

This invention relates in general to multiple different devices, at least some of which include rare earth material, integrated on a common chip.

BACKGROUND OF THE INVENTION

In many applications a plurality of different devices are used to perform different functions of the same process. In most of these types of applications it is extremely inefficient and difficult to provide each of the different devices on a separate chip and then couple the chips and the various functions together. Integration to incorporate different circuits on a common chip has been known for a long time but in all known instances each circuit uses substantially the same type of components and they are simply integrated into a common chip. This is possible because the various components can be manufactured using common steps, methods, or processes. Thus, for example, integrating n-type and p-type transistors on a common chip has been known for a long time.

Many completely different types of devices are used in some extensive processes and these completely different types of devices have, by necessity, been fabricated on separate chips and then integrated by either joining the separate chips (e.g. chip bonding) and interconnecting the devices and circuits, or simply interconnected by off-chip circuits.

It would be highly advantageous, therefore, to remedy the foregoing and other deficiencies inherent in the prior art.

Accordingly, it is an object of the present invention to provide new and improved multiple different rare earth devices integrated on a common chip.

An aspect of the present invention is to provide circuits or complex processes incorporating multiple different rare earth devices integrated on a common chip.

SUMMARY OF THE INVENTION

Briefly, to achieve the desired objects and aspects of the instant invention in accordance with a preferred embodiment thereof, provided is a single chip having multiple different devices integrated thereon for a common purpose. The chip includes a substrate having a peripheral area, a mid-chip area, and a central area. A plurality of FETs are formed in the peripheral area with each FET having a layer of single crystal rare earth material in at least one of a conductive channel, a gate insulator, or a gate stack. A plurality of photonic devices including light emitting diodes or vertical cavity surface emitting lasers are formed in the mid-chip area with each photonic device including a layer of single crystal rare earth material. A plurality of photo detectors are formed in the central area.

The desired objects and aspects of the instant invention are further realized in accordance with a specific embodiment of a single chip having multiple different devices integrated thereon for a common purpose. The chip includes a substrate with a contact layer positioned thereon. The contact layer includes an area having a doped portion and an overlying differently doped portion. A second layer is epitaxially deposited on the contact layer and includes one of a single crystal rare earth oxide and a single crystal rare earth silicate. A single crystal layer of doped semiconductor material is epitaxially deposited on the second layer and includes a first doped portion and an overlying differently doped portion. The single crystal layer of doped semiconductor material in conjunction with the second layer and the contact layer define at least one field effect transistor, the second layer and the contact layer define at least one photonics device, and the doped portion and the overlying differently doped portion of the contact layer define at least one photodetector.

The desired objects and aspects of the instant invention are further realized in accordance with a method of fabricating a single chip having multiple different devices integrated thereon for a common purpose. The method includes the steps of providing a substrate having a peripheral area, a mid-chip area, and a central area, forming a plurality of field effect transistors in the peripheral area with each field effect transistor having a layer including a rare earth in at least one of a conductive channel, a gate insulator, or a gate stack, forming a plurality of photonic devices including light emitting diodes or vertical cavity surface emitting lasers in the mid-chip area, each photonic device being formed with a layer including a rare earth, and forming a plurality of photo detectors in the central area.

The desired objects and aspects of the instant invention are further realized in accordance with a specific method of fabricating a single chip including the steps of providing a substrate and epitaxially depositing a contact layer on the substrate. The contact layer is doped to provide a lower area with a first type of doping and an overlying differently doped area. A second layer is epitaxially deposited on the contact layer and includes one of a single crystal rare earth oxide and a single crystal rare earth silicate. A single crystal layer of semiconductor material is epitaxially deposited on the second layer and is doped to form a first type doped lower area and an overlying area of differently doped type. The various layers are ultimately formed (e.g. during deposit or by etching, etc.) to define in the single crystal layer of doped semiconductor material in conjunction with the second layer and the contact layer at least one field effect transistor, define in the second layer and the contact layer at least one photonics device, and define in the first type doped lower area and the differently doped type overlying area of the contact layer at least one photodetector.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 3 is a simplified side view of another embodiment of different rare earth devices integrated on a single chip for a common purpose;

FIG. 4 is an enlarged partial view of specific components formed in the structure of FIG. 3;

FIG. 5 is a specific embodiment of the structure of

FIG. 4 illustrating formation and specific materials in more detail;

DETAILED DESCRIPTION OF THE DRAWINGS

Figure 1:
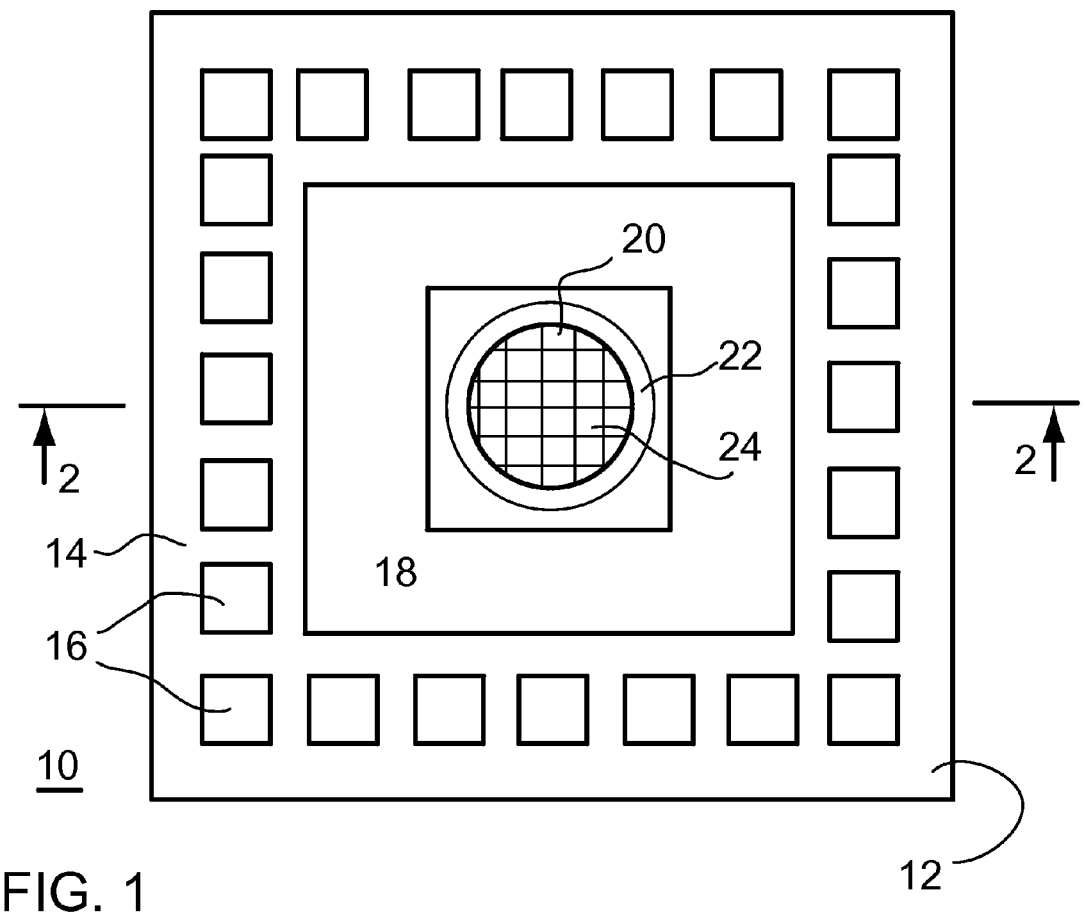
FIG. 1 is a top plan view of an embodiment of different rare earth devices integrated on a single chip for a common purpose.
Figure 2:
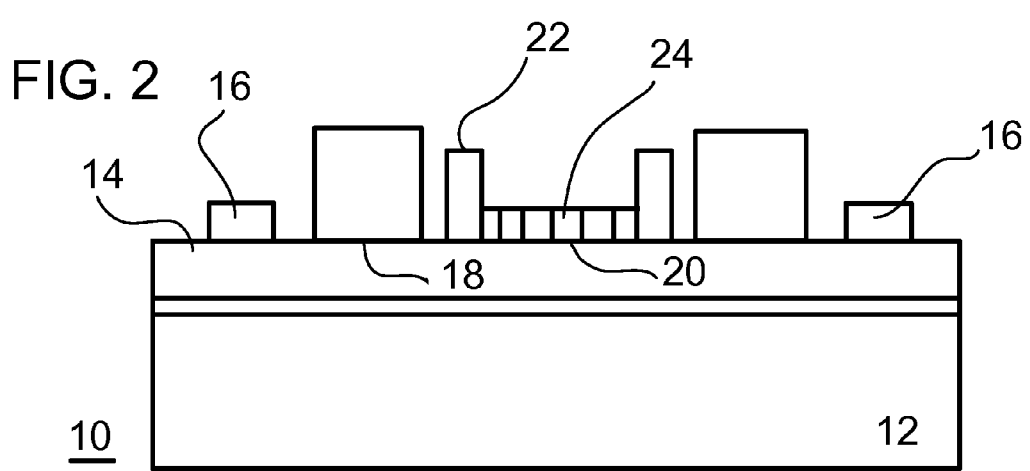
FIG. 2 is a sectional view as seen from the line 2-2 of FIG. 1.

Referring to FIGS. 1 and 2, an embodiment is illustrated of a plurality of different rare earth devices integrated on a single chip 10 for a common purpose, which in this specific example is for the purpose of analysis of samples. A substrate 12 is provided that may be, for example, a semiconductor-on-insulator (SOI) silicon substrate or a substrate including signal and/or ground planes with double, or more, buried insulator layers. Examples of SOI substrates can be found, for example in a United States Patent entitled "Semiconductor-on-Insulator Silicon Wafer", issued Mar. 28, 2006, bearing U.S. Pat. No. 7,018,484, or copending United States Patent Application entitled "Multilayered BOX in FDSOI MOSFETS", filed Dec. 8, 2006, bearing Ser. No. 11/635,895, both of which are incorporated herein by reference. Also, embodiments including signal and/or ground planes with double, or more, buried insulator layers are disclosed in United States Patent entitled "Signal and/or Ground Plane with Double Buried Insulator Layers and Fabrication Process", issued Jan. 29, 2008, bearing U.S. Pat. No. 7,323,396, incorporated herein by reference. In any of the various structures, the overall assembly is considered the "substrate" and is referred to herein by that title.

In this embodiment, a peripheral area 14 around the periphery or bounds of chip 10 includes a plurality of field effect transistor (FET) circuits 16 provided adjacent the periphery of substrate 12 (chip 10) so that they can easily be accessed by external circuitry in a well known manner (e.g. connection pins, contact pads, etc.). FET circuits 16 generally include driver and/or switching FETs or may be, for example, the double gate FETs described in United States Patent entitled "Double Gate FET and Fabrication Process", issued Apr. 29, 2008, bearing U.S. Pat. No. 7,364,974, incorporated herein by reference. In each FET circuit 16 the semiconductor layer forming the channel of the FET is formed of a rare earth material as described in the above referenced application. Also, in some instances the gate stack of the FET may include a rare earth material to enhance the operation and reduce leakage. While FET circuits 16 are illustrated as being arranged in peripheral area 14 around the complete periphery of substrate 12 (chip 10), it will be understood that in different applications or functions they may be arranged somewhat differently. For example, in many applications the circuitry being driven may be an array of devices arranged in one or more columns and one or more rows. In such applications driver circuits in FET circuits 16 will be arranged to comply with or align with the columns and rows.

Further, in some applications it may be desired to incorporate digital-to-analog (D/A) converters and/or analog-to-digital (A/D) converters at or adjacent the inputs and/or outputs of chip 10 and, accordingly, some or all of FET circuits 16 may include A/D and/or D/A converters as well as or instead of FET driver circuits. While other or additional circuits may be included in or adjacent the periphery of chip 10 it will be understood by those skilled in the art that the outside or peripheral area 14 of chip 10 generally includes circuits formed with FETs.

In this embodiment a mid-chip area, designated 18, is formed within the bounds of peripheral area 14 including FET circuits 16. In this specific embodiment, mid-chip area 18 includes photonic devices, such as light emitting diodes (LEDs) and/or vertical cavity surface emitting lasers (VCSELs). Examples of acceptable light emitting devices are disclosed in copending United States Patent Application entitled "Spontaneous/Stimulated Light Emitting p-Cavity Device", filed Jun. 21, 2006, bearing Ser. No. 11/472,087, incorporated herein by reference. In each photonic device the active area is formed by a rare earth material as described in the above application. While mid-chip area 18 is illustrated as including photonic devices arranged around the complete inner circumference of peripheral area 14, it will be understood that in different applications or functions they may be arranged somewhat differently. For example, in many applications the photonic devices may be arranged in an array with one or more columns and one or more rows on each side of mid-chip area 18.

While it will be understood that various photonic devices can be fabricated to generate light of virtually any desired color, it has been found that green light is the most effective for the analysis being performed on chip 10. Specifically for the example of analysis, mid-chip area 18 includes a plurality of photonics devices, such as PiN diodes or the like. As understood by those skilled in the art, PiN diodes include a layer of p-doped material, an intrinsic layer, and a layer of n-doped material. In the preferred embodiment, at least one layer of each of the PiN diodes is formed of rare earth material and it may be a common layer with one or more of the previously described devices. Thus, the preferred embodiment of photonics devices in mid-chip area 18 is green light generating LEDs. LEDs of this type are described in United States Patent entitled "Selective Colored Light Emitting Diodes", issued Jun. 17, 2008, bearing U.S. Pat. No. 7,388,230, incorporated herein by reference. Also, the LEDs in mid-chip area 18 may be fabricated so that generated light emanates upwardly from the LEDs, after which it will be reflected downwardly into a central area, designated 20. Alternatively, the LEDs in mid-chip area 18 may be fabricated so that generated light emanates to the side, directly into central area 20.

In this specific embodiment, central area 20 is illustrated as a circular area surrounded by a vertical wall 22 provided to act as a retainer for a liquid being analyzed. It will be understood that wall 22 could be a separate structure (as illustrated) or could be formed by encapsulation of the photonic devices in mid-chip area 18. Also, in some applications the process being performed may not be analysis and wall 22 may simply not be included. Specifically for the example of analysis, central area 20 includes a plurality of photo sensitive devices or photo detectors, such as PN diodes 24 or the like. In specific embodiments, at least one layer of the PN diode may include a rare earth material and the layer may be a common layer with one or more of the previously described devices. It will be understood that other types of photo detectors might be utilized but PN diodes 24 are preferred for their simplicity and ease of fabrication.

In the present structure, PN diodes 24 are arranged in rows and columns, and while a circular central area 20 is illustrated it will be understood that a square or other embodiment might be utilized if desired. The rows and columns of PN diodes are associated with specific photonics devices in mid-chip area 18 and the specific photonics devices are associated with specific FET circuits 16 so that in a preferred embodiment specific PN diodes can be addressed from external circuitry attached to FET circuits 16. Thus, a single input/output can be developed for each PN diode 24 or a common output involving all of the devices can be developed if very small signals are anticipated. It will be understood that the various components of chip 10 are illustrated in a simplified and separated arrangement for simplicity of understanding and in actual construction the various components will generally be tightly compacted for convenience of construction and utilization of space.

Turning to FIG. 3, another embodiment is illustrated of different rare earth devices integrated on a single chip 110 for a common purpose. Chip 110 includes a substrate 112 which may be, for example, a semiconductor-on-insulator (SOI) silicon substrate or a substrate including signal and/or ground planes with double, or more, buried insulator layers, generally as described above. In any of the various structures, the overall assembly is considered the "substrate" and is referred to herein by that title. Further, as described above, substrate 112 is generally divided into different areas which, in this specific example are designated a central area 114, a mid-chip area 116, and a peripheral area 118. Depending upon the specific application for which chip 110 is designed, areas 114, 116, and 118 may be simply designed in a square or round configuration with each area contained within the outside area or the areas may be meandering or otherwise positioned to perform the function for which they are designed.

In this embodiment, central area 114 includes photo detector devices (PD) 120, such as PN diodes or the like, mid-chip area 116 includes photonic devices 122, such as LEDs or VCSELs, and peripheral area 118 includes FET circuits 124, as explained above. In some specific instances the photo detectors may be PiN diodes also and may include a layer of rare earth material. Each photonic device 122 and FET circuit 124 includes one or more layers of rare earth material, generally serving as at least one of an active area, a very good insulator or, in some instances, a conducting layer (e.g. a rare earth oxide or a rare earth silicide). In this structure, analyzing apparatus can be incorporated by forming walls 126 around central area 114, either as a separate structure or as part of photonics devices 122. Walls 126 provide an enclosure for temporarily retaining a liquid or the like for analyzing.

In the fabrication of chip 110 and for convenience of operation, one or more blanket epitaxial layers 130 are deposited across the entire surface of chip 110 in the formation of photo detector devices 120 in central area 114. Photonics devices 122 are fabricated by epitaxially depositing a rare earth oxide or rare earth silicide layer 140 over mid-chip area 116 and peripheral area 118. FET circuits 124 are fabricated by epitaxially depositing doped layers 150 over peripheral area 118. In some applications all of the layers 130, 140 and 150 of the entire assembly can be epitaxially deposited in situ and the extra material above photo detector devices 120 and photonic devices 122 removed by selective etching or mask and etch techniques. In other applications it may be expedient to mask and deposit subsequent epitaxial layers by separate deposition processes as, for example, in the formation of FET circuits.

Referring to FIG. 4, a preferred embodiment of the rare earth devices of FIG. 3 are illustrated in more detail. In this specific embodiment a lower contact layer 130' is deposited on substrate 112' and includes a lower portion or layer 132' of n or p doped material with a heavily doped p or n layer 134' of material formed thereon. Layers 132' and 134' can be deposited as a single doped layer with the layer 134' receiving the additional doping later or can be deposited as separate doped layers. In either case it will be recognized that a (p/n or n/p) photodiode or photodetector 120 is formed by layers 132' and 134'.

An oxide layer 140' is positioned over lower contact layer 130', preferably, so as not to overlie photodetector 120. In this preferred embodiment oxide layer 140' is epitaxially deposited and is a single crystal layer of rare earth oxide ($RE_2O_3$) or a rare earth silicate ($RE_2SiO_5$). In either case the RE radical may include a mixture of rare earth materials, such as ($Gd_{0.9}Er_{0.1}$). The specific example of Gadolinium and Erbium generates a green light when excited, which light is preferred in many types of analysis, but other colors can be generated with different rare earth (individual or alloyed) materials. As a specific example, the thickness of layer 140' is approximately 2500 Å. Generally, oxide layer 140' is thin enough that it can overlie photo detector 120 without substantially effecting the operation. However, if deemed preferable, oxide layer 140' can either be preferentially deposited or etched to remove it in a later process. Also, more than one oxide layer 140' can be included to form the various devices on the chip.

A single crystal layer 150' of silicon, or alternatively germanium, is epitaxially deposited over oxide layer 140' and either includes a heavily doped (p or n) portion 152' directly in contact with oxide layer 140' and either a lighted doped portion or an opposite conductivity portion 154' in overlying relationship. Because oxide layer 140' is single crystal, layer 150' can be deposited thereon in single crystal form. Upper layer 154' may be the upper contact for the entire structure or a contact layer may be deposited over all or a portion of layer 150'. Current will then flow from the upper contact (e.g. layer 154'), through layer 152', RE oxide layer 140', layer 134', and to lower contact layer 132'.

Figure 5:
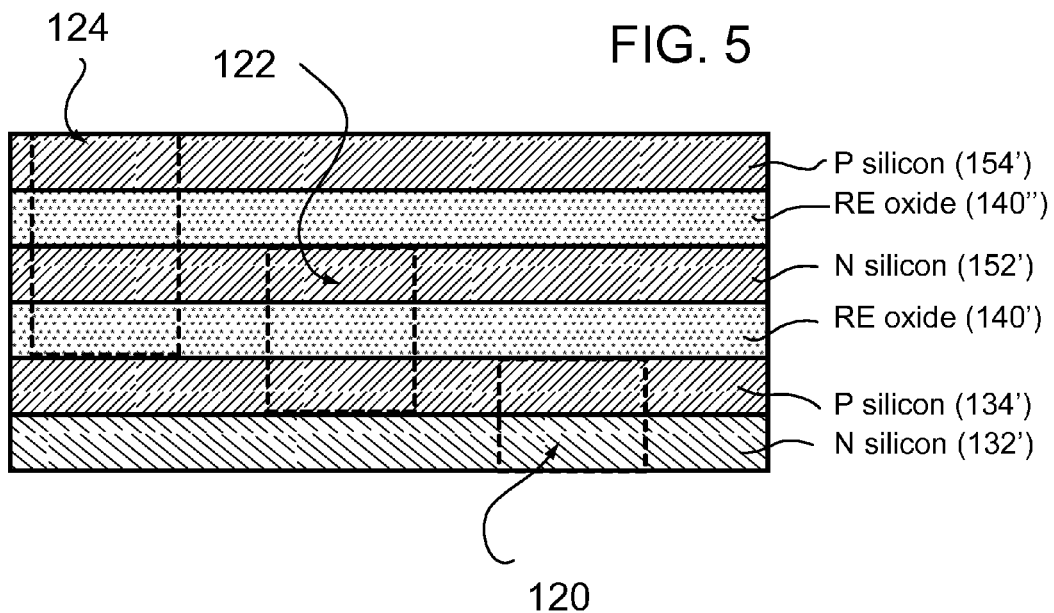

A specific example of the above described preferred rare earth devices is illustrated in FIG. 5 to further clarify the various devices. Also, in this example the various layers are deposited as blanket layers and may be partially removed (e.g. etching, selective deposition, etc.) or may remain in place if operation of the devices is not impaired. As can be seen, in this specific embodiment, included for example only, a layer 132' of n silicon is formed on the upper surface of a substrate (e.g. substrate 112' FIG. 4), which in this case is single crystal silicon. Then a layer 134' of p doped silicon is deposited on layer 132'. It will be understood that layers 132' and 134' could be deposited as a single layer (hereinafter referred to as a contact layer) with a doping change as the single layer is deposited or doped differently after deposition. A first layer 140' of RE oxide is epitaxially deposited on the surface of layer 134' in a single crystal formation. An n doped single crystal silicon layer 152' is epitaxially deposited on oxide layer 140' and a second layer 140" of RE oxide is epitaxially deposited on the surface of layer 152', both preferably in a single crystal formation. A p doped single crystal layer 154' is epitaxially deposited on layer 140". Layers 132' and 134' combine as a photodetector device 120, layers 134', 140', and 152' combine as a PiN diode 122 light generator. Layers 140', 152', 140", and 154' combine to form a FET 124 in combination with the other different rare earth devices integrated on the single chip.

Figure 6:
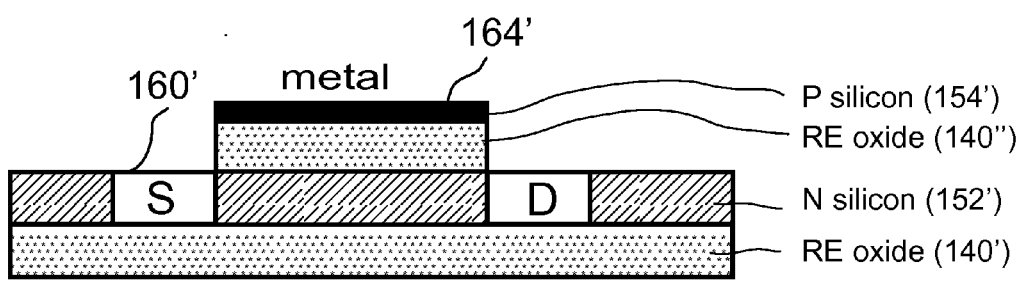
FIG. 6 is a more detailed view illustrating the formation of a FET in the specific materials of FIG. 5.

Referring additionally to FIG. 6, a more detailed illustration is provided to show one embodiment of a formation of a FET in the structure of FIG. 5. In this embodiment RE oxide layer 140' acts as the substrate and n silicon layer 152' is the active layer with a source 160' and a drain 162' formed therein. RE oxide layer 140" forms the gate dielectric and p silicon layer 154' forms the gate electrode or the gate stack in combination. A metal contact layer 164' is deposited on the surface of the gate electrode or gate stack. It will be understood that the specific embodiment illustrated can be formed using a variety of different processes or methods and the illustration is to provide clarity and better understanding. Also an external connection can be provided to source 160' in this specific embodiment and drain 162' is internally coupled to the other devices to serve, for example, as a driver or the like. In other embodiments of the FET, the conductive channel layer can be formed of a single crystal conductive rare earth material and the gate stack can include a single crystal rare earth conductor instead of or in addition to p silicon layer 154' (see the above cited copending applications for example).

Figure 7:
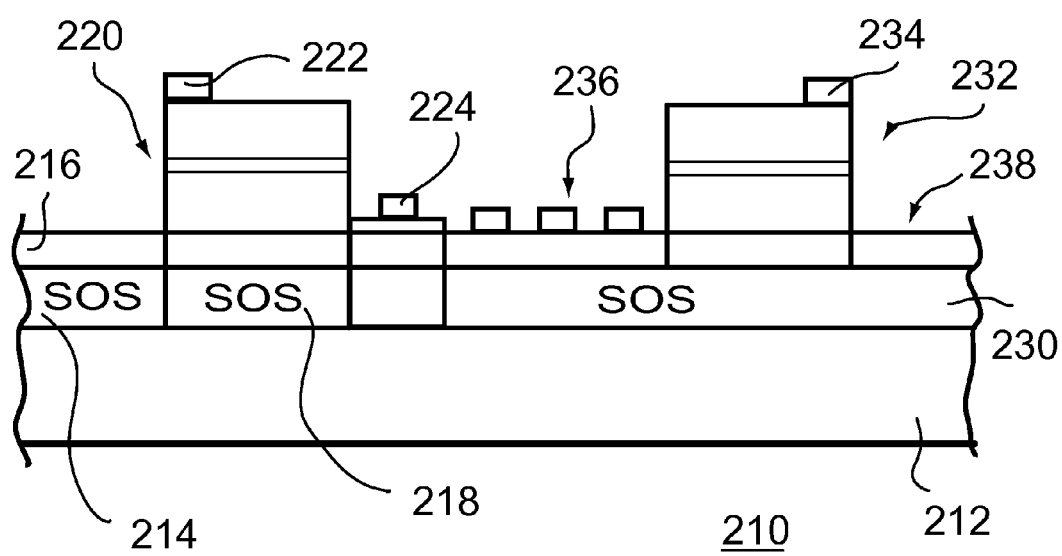
FIG. 7 is a simplified side view of another embodiment of different rare earth devices integrated on a single chip for a common purpose.

Turning to FIG. 7, another embodiment is illustrated of different rare earth devices integrated on a single chip 210 for a common purpose. Chip 210 includes a substrate 212 which may be, for example, a semiconductor-on-insulator (SOI) silicon substrate or a substrate including signal and/or ground planes with double, or more, buried insulator layers, generally as described above. In any of the various structures, the overall assembly is considered the "substrate" and is referred to herein by that title.

In this structure a layer 214 of semiconductor material is deposited or grown on the silicon substrate 212 and one or more FETs 216 are formed in layer 214 in any well known procedure. A layer 218 of semiconductor material is deposited or grown on the silicon substrate 212 adjacent layer 214 and may be a common layer with layer 214, at least in some applications. A VCSEL or LED 220 is fabricated on or as a part of layer 218. Further, a photo detector 222 may be fabricated on the upper surface of VCSEL or LED 220 either as a control device or as a separate component. Alternatively or in addition to photo detector 222, a photo detector 224 may be formed separately along side VCSEL or LED 220 to perform a separate function.

In what might be a separate structure or a continuation of the structure described above, a layer 230 of semiconductor material is deposited or grown on the silicon substrate 212. A VCSEL or LED 232 is fabricated on or as a part of layer 230. A photo detector 234 may be fabricated on the upper surface of VCSEL or LED 232 either as a control device or as a separate component. FETs and/or photo detectors are fabricated in an area 236 to one side of VCSEL or LED 232 on or as a part of layer 230. Also, FETs and/or photo detectors are fabricated in an area 238 at the opposite side of VCSEL or LED 232 on or as a part of layer 230.

Thus, new and improved multiple different rare earth devices are integrated on a single chip for a common purpose. Generally, the multiple different rare earth devices include devices such as FETs, double gate FETs, photonics devices such as LEDs and VCSELs, and (in some embodiments) photo sensitive or photo detector devices. At least one common purpose that is achieved by the integration of multiple different rare earth devices on a single chip is the provision of an analyzer. For the purpose of analyzing materials, it has been found that LEDs and/or VCSELs that emit green light are most valuable.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A single chip having multiple different devices integrated thereon for a common purpose, the chip comprising:
   a silicon substrate having a peripheral area, a mid-chip area, and a central area;
   a plurality of field effect transistors formed in the peripheral area, each field effect transistor having a layer including a rare earth in at least one of a conductive channel, a gate insulator, or a gate stack;
   a plurality of photonic devices including at least one of light emitting diodes and vertical cavity surface emitting lasers formed in the mid-chip area, each photonic device having a layer including a rare earth; and
   a plurality of photo detectors formed in the central area.

2. A chip as claimed in claim 1 wherein the silicon substrate includes one of a semiconductor-on-insulator (SOI) silicon substrate or a substrate including signal and/or ground planes with double buried insulator layers.

3. A chip as claimed in claim 1 wherein the plurality of field effect transistors include double gate field effect transistors.

4. A chip as claimed in claim 1 wherein the plurality of field effect transistors are incorporated into driver circuits.

5. A chip as claimed in claim 1 wherein the plurality of field effect transistors are incorporated into A/D or D/A circuits.

6. A chip as claimed in claim 1 wherein the plurality of field effect transistors have gate insulators including a single crystal rare earth oxide, a rare earth nitride, a rare earth phosphide, or combinations thereof.

7. A chip as claimed in claim 1 wherein the plurality of field effect transistors have gate stacks including a single crystal rare earth dielectric.

8. A chip as claimed in claim 1 wherein the common purpose of the chip is analysis and the chip further includes a liquid retaining wall surrounding the central area for receiving therein a liquid to be analyzed.

9. A chip as claimed in claim 1 wherein the plurality of photonics devices include PiN diodes.

10. A chip as claimed in claim 1 wherein the layer including a rare earth of the photonic devices includes one of a rare earth oxide ($RE_2O_3$) and a rare earth silicate ($RE_2SiO_5$).

11. A chip as claimed in claim 10 wherein the RE radical in ($RE_2O_3$) and in ($RE_2SiO_5$) includes ($Gd_{0.9}Er_{0.1}$).

12. A single chip having multiple different devices integrated thereon for a common purpose, the chip comprising:
   a substrate;
   a contact layer of single crystal semiconductor material positioned on the substrate, the contact layer including an area having a doped portion and an overlying differently doped portion;
   a first insulating layer epitaxially deposited on the contact layer and including one of a single crystal rare earth oxide and a single crystal rare earth silicate;
   a first single crystal layer of doped semiconductor material epitaxially deposited on the first insulating layer;
   a second insulating layer epitaxially deposited on the first single crystal layer of doped semiconductor material and including one of a single crystal rare earth oxide and a single crystal rare earth silicate;
   a second single crystal layer of doped semiconductor material epitaxially deposited on the second insulating layer;
   the second single crystal layer of doped semiconductor material in conjunction with the second insulating layer and the first single crystal layer of doped semiconductor material defining at least one field effect transistor, the first layer of semiconductor material, the first insulating layer, and the contact layer defining at least one photonics device, and the doped portion and the overlying differently doped portion of the contact layer defining at least one photodetector.

13. A chip as claimed in claim 12 wherein the one of single crystal rare earth oxide and the single crystal rare earth silicate included in the first and second insulating layers include ($RE_2O_3$) and ($RE_2SiO_5$), respectively.

14. A chip as claimed in claim 13 wherein the RE radical in ($RE_2O_3$) and in ($RE_2SiO_5$) includes ($Gd_{0.9}Er_{0.1}$).

15. A chip as claimed in claim 12 wherein the first single crystal layer of doped semiconductor material includes one of silicon and germanium.

* * * * *